United States Patent
Hamilton et al.

(10) Patent No.: US 7,005,611 B2
(45) Date of Patent: *Feb. 28, 2006

(54) LARGE AREA ALUMINA CERAMIC HEATER

(75) Inventors: Douglas Campbell Hamilton, Lexington, KY (US); Jerry Wayne Smith, Irvine, KY (US); Larry Earl Stahlman, Versailles, KY (US); Kiyoshi Mizushima, Matto (JP); Hisakazu Hujimoto, Matto (JP); Makoto Aoki, Kanazawa (JP)

(73) Assignee: Lexmark International, Inc., Lexington, KY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/007,746

(22) Filed: Dec. 8, 2004

(65) Prior Publication Data

US 2005/0118404 A1 Jun. 2, 2005

Related U.S. Application Data

(63) Continuation of application No. 10/229,369, filed on Aug. 26, 2002, now Pat. No. 6,960,741.

(51) Int. Cl.
*H05B 1/00* (2006.01)
(52) U.S. Cl. .................. 219/216; 219/542; 219/543; 219/544; 219/547; 219/548
(58) Field of Classification Search ................ 219/216, 219/542–548, 443.1, 306–308, 432–435; 392/432–435; 338/306–308
See application file for complete search history.

(56) References Cited

U.S. PATENT DOCUMENTS

| | | | |
|---|---|---|---|
| 3,911,188 A | 10/1975 | Torti, Jr. et al. | 428/218 |
| 3,931,438 A | 1/1976 | Beall et al. | 428/218 |
| 3,991,149 A | 11/1976 | Hurwitt | 264/63 |
| 4,401,729 A | 8/1983 | Claussen et al. | 428/623 |
| 4,511,612 A | 4/1985 | Hüther et al. | 428/36 |
| 4,775,565 A | 10/1988 | Kubota et al. | 428/35 |
| 5,264,681 A | 11/1993 | Nozaki et al. | 219/544 |
| 5,268,533 A | 12/1993 | Kovacs et al. | 174/52.4 |
| 5,499,087 A | 3/1996 | Hiraoka et al. | 355/285 |
| 5,753,893 A | 5/1998 | Noda et al. | 219/548 |
| 6,132,542 A | 10/2000 | Cutler et al. | 156/89.11 |
| 6,236,027 B1 | 5/2001 | Miyata et al. | 219/542 |
| 6,486,447 B1 | 11/2002 | Miyata | 219/444.1 |
| 6,762,396 B1 | 7/2004 | Abbott et al. | 219/543 |

FOREIGN PATENT DOCUMENTS

JP 07-104592 4/1995

*Primary Examiner*—Robin O. Evans
*Assistant Examiner*—Vinod Patel
(74) *Attorney, Agent, or Firm*—Grossman, Tucker, Perreault & Pfleger, PLLC (57) ABSTRACT

A large area heater used, for example, in a laser printer belt fuser or as cooking surface, has an alumina substrate in which two bowed parts of alumina ceramic having opposed concave regions are formed together as a laminate. Electrical resistors are deposited on the laminate. The alumina laminate provides excellent resistance to uneven heating or other thermal stress. Alumina ceramic is readily shaped during manufacture and manufacturing costs and yield are good. A wide variety of large area heaters can usefully employ the laminate.

28 Claims, 6 Drawing Sheets

LARGE AREA ALUMINA CERAMIC HEATER

RELATED APPLICATIONS

This application is a continuation of U.S. patent application Ser. No. 10/229,369 filed Aug. 26, 2002 now U.S. Pat. No. 6,960,741.

TECHNICAL FIELD

This invention relates to resistive electrical heaters having ceramic support or bond, which heat large areas under periodic high thermal stress. Such heaters have many applications such as in toner fusers for electrophotography, household and industrial cooking surfaces, self-heating pots, and potentially many special-purpose applications.

BACKGROUND OF THE INVENTION

Alumina ceramics are widely used for their general sturdiness and good conductivity of heat. Compared with similar materials, such as aluminum nitride ceramics, alumina ceramics are very cost effective. The manufacturing and material costs of alumina ceramics are relatively inexpensive and provide high yields of the items manufactured.

Prior to this invention, however, alumina ceramics could not be used in high thermal stress applications. Such applications involve one part of the ceramic being at substantially different temperature than another part. In a toner fuser, high stress occurs when a narrow thick media is being fused in a heater wide enough for standard media. The ceramic cracks because the media cools the region of the ceramic to which it is proximate, while the more distant parts of the ceramic are spaced both from the media and a backup support surface and gain temperature. In a stovetop-cooking environment, such thermal stress would occur when relatively cool water is spilled on part of the burner.

Overcoming this thermal stress weakness of alumina ceramics permits this cost effective material to be used in a wide variety of applications where it could not previously have been used. During the manufacturing process, alumina ceramics can be shaped, for example, in the form of a pot, and subsequently fixed in that form. Therefore, the usefulness of overcoming thermal stress in alumina ceramics is not limited to applications having flat surfaces.

This invention employs a described alumina ceramic laminate. Laminate ceramic printing elements having printed dots of heating elements, typically of size of 0.125 mm in diameter, is known. Since the heating elements are individual elements, the heating area of each heating element is small relative to the surface area of the ceramic support. A preferred alumina ceramic laminate employed with this invention is obtained from Nikko Company, of Japan, under their product designation, 500-459. However, other ceramic laminate materials having the characteristics of the alumina ceramic laminate may also be used.

DISCLOSURE OF THE INVENTION

This invention employs an ceramic material having exterior surfaces that are in compression relative to the bulk ceramic material. In a preferred embodiment, a ceramic material having exterior surfaces in compression is provided by two bowed parts of alumina ceramic having opposed concave regions adhered together as a laminate. The two layers may be sintered together under heat and pressure with no identifiable adhesive or an intermediate adhesive layer may be employed. The laminate itself is preferably substantially flat, but it may be shaped under pressure, for example to form a pot with a flat bottom and vertical sides, before it is cured to its final condition, which is rigid. Electrical resistive elements for heating are then applied to the surface of the ceramic in a standard manner, such as by thick film printing.

In another preferred embodiment, a laminate ceramic material is provided by at least three or more ceramic material layers, wherein the outer ceramic layers have substantially the same coefficient of thermal expansion and the center layer or layers has a different coefficient of thermal expansion relative to the outer layers so that the outer most surfaces of the outer layers will be in compression. Alternatively, the center layer or layers can have a different firing shrinkage.

The thermal stress resistance of a ceramic laminate is significant in operation when the heating is substantially uninterrupted over a length which extends in one direction at least roughly about 5 millimeters (mm) and preferably at least about 15 millimeters. In such large area of heating, cooling may occur on one area of the heater while another area of the heater becomes much hotter than the cooled area. Employing the laminate of this invention, the ceramic heater is highly resistant to thermal cracking, and so current functioning and future use are not jeopardized.

BRIEF DESCRIPTION OF THE DRAWINGS

The details of this invention will be described in connection with the accompanying drawings, in which FIG. 9 illustrates a flat heater with both heater resistors and their contacts of the same side for applications such as space heaters, dryer heater and the like.

DESCRIPTION OF THE PREFERRED EMBODIMENTS

Figure 1:
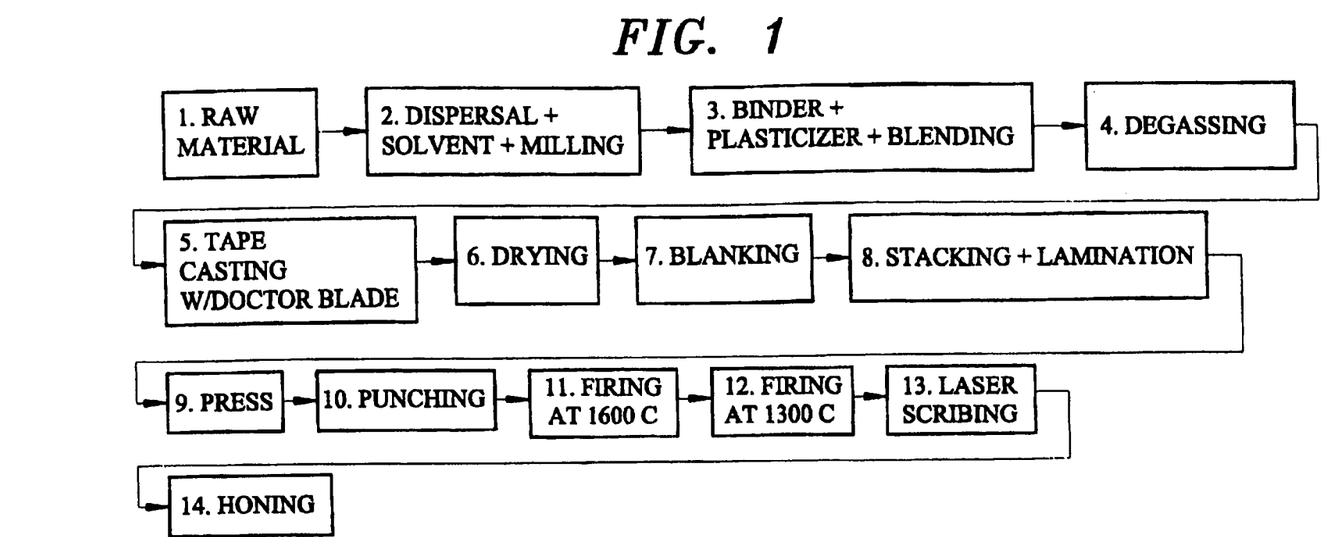
FIG. 1 is a flow diagram of the manufacture of a ceramic laminate in accordance with this invention.

The substrate processing flow is shown in FIG. 1. Raw material consisting of alumina (aluminum oxide—$Al_2O_3$) powder such as Sumitomokagaku AL-43, Alcoa A-14, Pechiney P-122; low sodium aluminum powder, each with an average particle size of approximately 3 microns, is blended with Magnesium Oxide (MgO), Silicon Dioxide ($SiO_2$), Calcium Carbonate ($CaCO_3$)), binders, plasticizers, and a solvent to form a slurry. Generally, the beginning slurry composition for 96% alumina consists of: 60–70 wt.

% alumina powder, 2–4 wt. % sintering flux (MgO, SiO$_2$, and CaCO$_3$—each having particle sizes of approximately 2 microns), 3–6 wt. % of acrylic resin based binder such as PVB (poly vinyl butyl), 1–5 wt. % of plasticizer such as DBP (dibutyl phthalate) or DOP (dioctyl phthalate) and 20–30 wt. % of solvent such as toluene. The slurry composition is then degassed by placing slurry into a vacuum tank, which has 70–76 cm Hg of vacuum, for 5 hours.

The degassed slurry or "slip" preparation is formed into a sheet by dispensing the "slip" onto a carrier tape. The carrier tape may be cellulose acetate, MYLAR polyester or TEFLON fluorine polymer as described in U.S. Pat. No. 3,991,149. In the example described in this application, PET (polyethylene terephthalate) is the chosen carrier tape material. An adjustable doctor blade is used to control the resulting sheet thickness, along with the feeding speed of the carrier tape. After being formed by the doctor blade, the resulting sheet of slurry or "slip" preparation is dried while on the carrier tape. The typical drying condition is 100 deg. C./1 hour. After drying, the resultant sheet, now said to be in the "green state" is rolled into a reel, while the carrier tape is also rolled onto a take-up reel.

Figure 2:
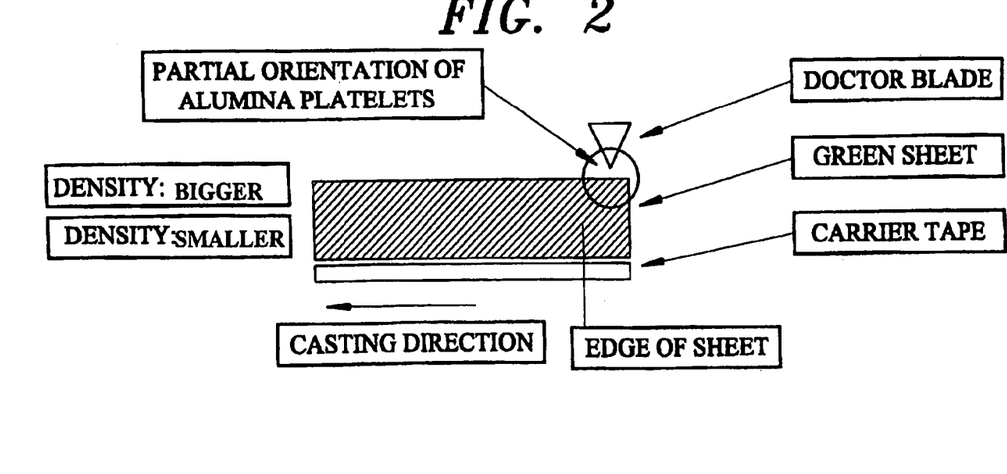
FIG. 2 illustrates the casting and doctoring operation of the manufacture of FIG. 1.
Figure 3:
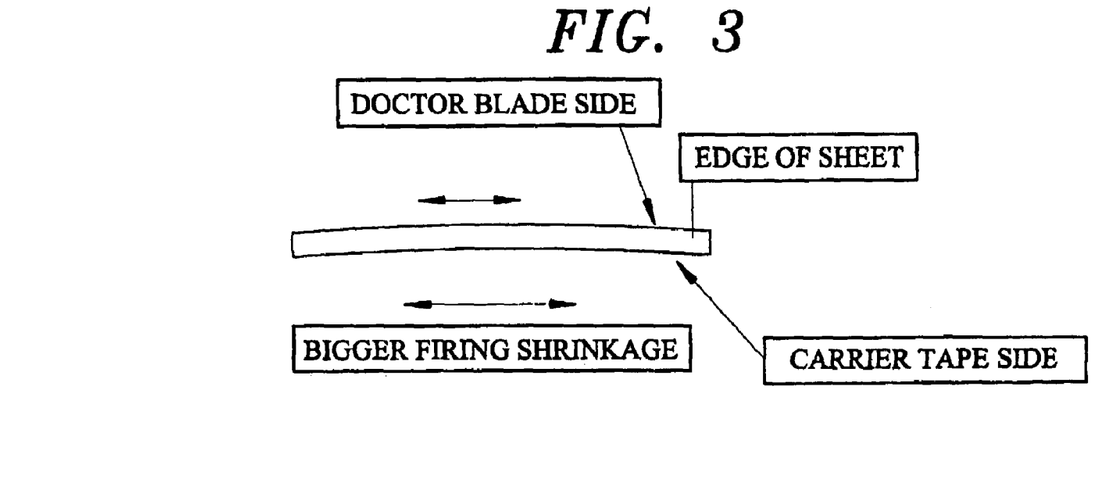
FIG. 3 illustrates the bowing of a ceramic sheet in the operation of the manufacture of FIG. 1.

The doctor blade process is superior to other processes, such as extrusion, in terms of overall uniform density and the number and size of pores in the resulting ceramic substrate. However, doctor blade processing is also subject to differences in resultant density from top to bottom of the sheet. Sheets created by the tape casting method described have a higher density on the doctor blade side (top side of sheet) than on the carrier tape side (bottom side of sheet). This occurs because the doctor blade reorients some of the alumina platelets during forming of the sheet, creating a lower porosity adjacent the doctor blade. Furthermore, because the sheet casting is heated during forming from the carrier tape side, higher shrinkage occurs on that side (bottom side). The result is a bowing or camber in the sheet, with the center of the sheet being higher than the edges. See FIG. 2 and FIG. 3.

The bow or "camber" created by the doctor blade tape casting method introduces differences in physical strength characteristics on the top and bottom surfaces. The doctor blade surface becomes compressed when the sheet is flattened. The carrier tape surface is stretched or placed under tension when the sheet is flattened. Compression and tension both affect how resistant the material is to breaking under either mechanical or thermal stress. A surface in tension is more likely to crack under stress than a surface in compression. Surface compression increases mechanical strength and thermal shock resistance over either a surface free of tension or compression, or a surface under tension.

Figure 4:
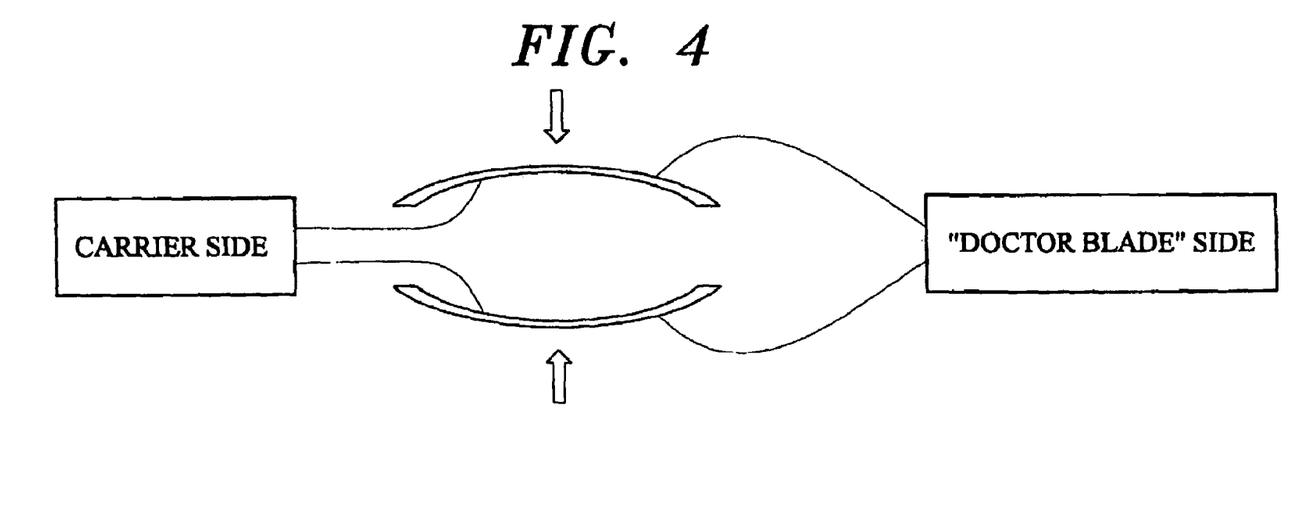
FIG. 4 illustrates two ceramic sheets with concave sides opposed which will then be pressed together into a laminate in the operation of manufacture of FIG. 1.
Figure 5:
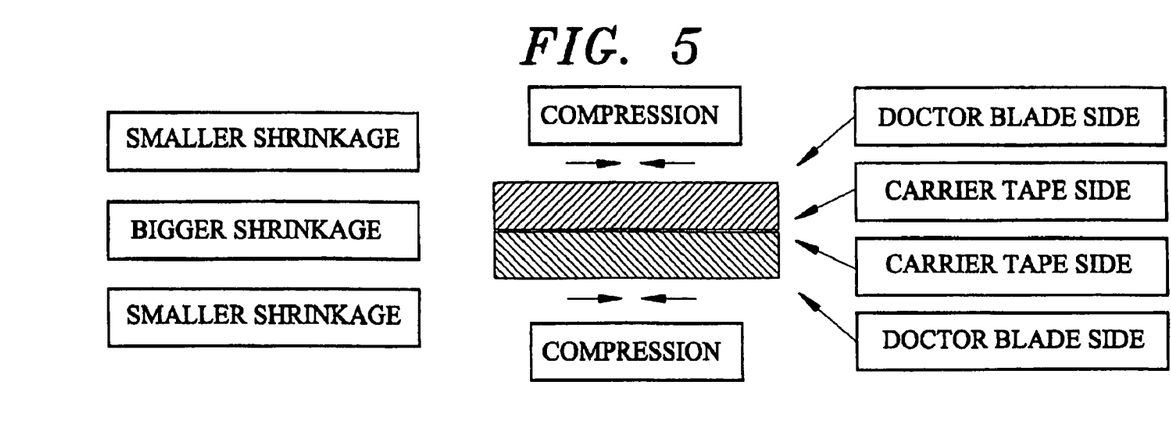
FIG. 5 illustrates the resulting laminate from the operation of FIG. 1.

The two layer laminate substrate described optimizes the strength characteristics of the resultant substrate by bringing both outer surfaces into compression as shown in FIG. 4 and FIG. 5. The lamination process is accomplished by stacking the green tape with the bottom layer having the bowing or camber directed upward and the top layer having the bowing or camber directed downward, thus having the concave sides opposed. This stacked green tape is heated in that status to 80 deg. C. while held flat under 80–120 kg/sq. cm of pressure for 2–5 minutes in order to form the lamination. The plasticizer contained in the green tape is selected to have a glass transition temperature range of 0–20 deg. C. for optimal lamination strength.

A two layer ceramic material made according to the process described herein has an overall thickness of about 2 millimeters. Thicker ceramic materials may be provided by pressing together multiple two-layer ceramic materials or by providing three or more layers of ceramic materials wherein the outer layers have substantially the same coefficient of thermal expansion and the inner layer or layers a lower coefficient of thermal expansion so that in operation the outer surfaces of the outer layers are put in compression by the slower expansion rate of the inner layer or layers. Alternately, thicker ceramic materials may be provided by pressing together multiple two-layer ceramic materials or by providing three or more layers of ceramic materials wherein the outer layers have substantially the same firing shrinkage and the inner layer or layers a higher firing shrinkage so that in curing the outer surfaces of the outer layers are put in compression by higher shrinkage of the inner layer or layers.

It is contemplated that the outer ceramic layers are provided by the same material, however all layers may be different materials, provided the outer layers have substantially the same thermal characteristics.

The laminated substrate is punched in the green state, forming sections of green tape of a suitable size for firing. A typical punched size for this application is 300 mm×100 mm. The punched, "green" pieces of laminated substrate are then sprayed with alumina powder in order to prevent sticking between pieces and fired in a furnace at 1600 deg. C. for 30 Hours. This firing sinters the substrate pieces. The pieces are then fired at 1300 deg. C. for 45 hours. This second firing serves the purpose of reducing the amount of curvature or camber in the pieces. A water spray is used to remove the alumina powder from the surface of the fired substrates. Between firings, red dye is used to detect cracks in the substrates. The dye is removed in the second firing process.

For applications such as heaters, an additional process of laser scribing (with CO$_2$ laser) is typically performed. Honing, and annealing may also be performed as a means of reducing micro-cracks created by the laser scribing.

Laser scribing is performed using a CO$_2$ laser set to the following:

Frequency: 400 Hz
Pulse: 200 micron
Speed: 100 mm/sec
Power: 140 Watts
Depth: 700 micron In this example, the fired substrate is scribed into 9 heater substrate array patterns.

Micro-cracks produced by laser scribing may be reduced by honing; using a water spray delivered during a buff-grinding operation and containing 400 mesh (100–300 micron particle size) alumina powder. The honing spray is delivered at 400 mm/sec or for 5 minutes.

Micro-cracks can also be reduced further by annealing the laser-scribed substrates in a furnace at 1400 deg. C. for 40 hours. Annealing also removes permanent stresses from the substrate.

The amount of camber and other dimensions are checked following annealing. Visual inspection is also performed.

| Heater Printing Process Flow Table: | |
| --- | --- |
| Process | Specification/Supplier |
| 96% Alumina Substrate | Thickness = 2.0 ± 0.16 mm |
| | Work Size: 285.0 ± 0.1 × 89.2 ± 0.1 mm |
| | (9 up arrays) |
| Conductor (Back) Print | Ag/Pd: Thickness = 12 ± 2 micron |
| | Tanaka TR 4865 |

| Heater Printing Process Flow Table: | |
|---|---|
| Process | Specification/Supplier |
| Conductor (Front) Print | Ag/Pt: Thickness = 12 ± 2 micron DuPont D 5164N |
| Resistor | Ag/Pd Low ohm resistor: 100 m ohm (Tanaka TR 9100) + 40 m ohm (Tanaka TR 9040) |
| Resistance adjust (Blend) | Target resistance: 80 m ohm Target TCR: 182 ppm (from room temp. to 190° C.) |
| Preliminary Test | Resistance: 13.6 ± 0.7 ohm @ Room Temperature Resistance: 14.0 ± 0.7 ohm @ 190 C. |
| Resistor Print | Thickness = 10.5 ± 1.5 micron |
| Resistance Test (1) | Resistance: 13.6 ± 0.7 ohm @ Room Temperature |
| Glass (Insulation) | Thickness = 35 ± 5 micron (Total 3 layers: Print Dry Fire + Print Dry Print Dry Fire) |
| Glass (Top) | Thickness = 10 ± 2 micron (1 layer) |
| Resistance test (2) | Resistance = 12.85 ± 0.7 ohm @ Room Temperature Isolation resistance: 100 M ohm @ 250 VDC |
| Visual Inspection | Pits/Dents/Scratches/Registration/ Contamination etc |
| Ag Epoxy | Epo-TEK/E3082 or E3084 |
| Mount (Thermistor) | SEMITEC/364FT-3P |
| Cure Silver Epoxy | Minimal cure 150 deg. C. for 30 minutes |
| Encapsulant | GE Toshiba/TSE 326 Silicone |
| Cure Encapsulant | Cure in air oven for 1 hour at 150 deg. C. |
| Encapsulation | Approved encapsulant |
| Singulation | Unit Size: 259.5 + 0.5/−0.1 × 8.8 + 0.5/−0.1 mm Camber: Max. 0.3 mm |

| Heater Printing Materials Table: | | | | |
|---|---|---|---|---|
| Application | Supplier | Part # | Specification | Remarks |
| Substrate | NIKKO | TBD | Thickness: t = 1.50 ± 8% mm Work size = 89.2 ± 0.1 mm × 285 ± 0.1 mm (9 ups) Unit Size: 259.5 × 8.8 mm Tolerance: ±0.2 mm | |
| Conductor | DuPont | D5164N | Application: Front Metal Body: Ag/Pt Sheet Resistivity: Typical 3 m ohm at 10 micron Fired Thickness: 16–18 microns | |
| | Tanaka | TR4865 | Application: Back Metal body: Ag/Pd = 70/30 Sheet resistivity: Less than 35 m ohm at 10 micron Dried Thickness: 17–19 microns | |
| Resistor | Tanaka | TR9040 | Sheet Resistivity: 40 m ohm at 10 micron Resistivity tolerance (Batch to Batch): Less than ±30% Deviation of resistivity: Less than 10% Fired thickness: 11 ± 2 micron Hot TCR: 350–450 ppm/deg. C. Cold TCR: 350–450 ppm/deg. C. | Blend 9040:9100 = 1:4 |
| | | TR9100 | Sheet Resistivity: 100 m ohm at 10 micron Resistivity tolerance (Batch to Batch): Less than ±30% Deviation of resistivity; Less than 10% Fired thickness: 11 ± 2 micron Hot TCR: −50–50 ppm/deg. C. Cold TCR: 0–90 ppm/deg. C. | |
| Glass | Asahi Glass | AP5707 | Application: Insulation TCE: 7.5–8.1 ppm Annealing Point: 445–465 deg. C. Crystallization Point: 870–900 deg. C. Insulation Resistance: Greater than E12 ohm Breakdown Voltage BDV: Greater than 1000 VDC (at less than thickness used) | 3 layer print |

-continued

Heater Printing Materials Table:

| Application | Supplier | Part # | Specification | Remarks |
|---|---|---|---|---|
| | | AP5349 | Application: Surface Roughness<br>TCE: 5.9–6.5 ppm<br>Annealing Point: 650–670 deg. C.<br>Surface Roughness (Rz): Less than 0.8<br>Dielectric withstanding: Greater than 1.5 KVAC | 1 layer print |

Heater Printing Process Description

The heater can be created on the ceramic substrate by either thick film printing or thin film deposition. If thin film deposition is used, either the top surface must be glazed or 99.6% alumina must be used in order to improve the surface roughness from about 1 micron Ra to about 0.15 micron Ra. Firing is typically done in a muffle furnace to separate combustion gases from the ceramic.

For the thick film printing described in this example, silver palladium paste and silver platinum paste are used to print the conductor patterns. The conductor on the front side (resistor side) of the alumina substrate is printed using DuPont D5164N paste, a silver platinum conductor having a typical sheet resistivity of 3 milli-ohms per square at 10 microns. The material has a viscosity of 275+/−35 Pa s. The printed pattern is achieved using a 200 mesh screen and a "squeegee" force of about 1.0–2.0 Kg/cm$^2$ at a printing rate of about 300 mm/sec. The printed wet thickness is about 21–22 microns, but is reduced to 16–18 microns after drying and firing. Drying (settling) is performed at 25 deg. C. for 5–10 minutes followed by a drying oven bake at 150 deg. C. for 10–15 minutes. Firing is performed at a peak temperature of 850 deg. C. for a 30 minute to 1 hour firing schedule. A typical 30 minute firing profile consists of a firing rise rate of approximately 95 deg C./minute from room temperature (25 deg. C.) to 500 deg. C., a firing rise rate of approximately 70 deg. C./minute from 500 deg. C. to a peak temperature of 850 deg. C., holding at the 850 deg. C. peak temperature for 10 minutes, a firing descent rate of approximately 70 deg. C./minute from 850 deg. C. to 500 deg. C., and a descent rate of approximately 95 deg. C./minute from 500 deg. C. to room temperature (25 C.).

The printed conductor pattern on the backside of the heater (thermistor side) is completed using Tanaka TR 4865 silver palladium paste. This material has a sheet resistivity of less than 35 milli-ohms per square at 10 microns and a viscosity of 350 Pa·s. It is printed at a wet thickness of about 21–22 microns, using a screen of 250 mesh and a squeegee force of about 1.0–2.0 Kg/cm$^2$, at a printing rate of about 300 mm/sec. The thickness of this layer is 17–19 microns after drying and firing. As with the front side conductor, drying (settling) is performed at 25 deg. C. for 5–10 minutes, followed by a drying oven bake at 150 deg. C. for 10–15 minutes.

Firing is performed at a peak temperature of 850 deg. C. for a 30 minute to 1 hour firing cycle. A typical 30 minute firing profile consists of a firing rise rate of approximately 95 deg. C./minute from room temperature (25 deg. C.) to 500 deg. C., a firing rise rate of approximately 70 deg. C./minute from 500 deg. C. to a peak temperature of 850 deg. C., holding at the 850 deg. C. peak temperature for 10 minutes, a firing descent rate of approximately 70 deg. C./minute from 850 deg. C. to 500 deg. C., and a descent rate of approximately 95 deg. C./minute from 500 deg. C. to room temperature (25 deg. C.).

The resistor material for the application described is a blended mixture of material such as Tanaka TR9040 silver palladium paste and Tanaka TR9100 silver palladium paste. The Tanaka TR9040 silver palladium paste has a sheet resistivity of 40 milli-ohms per square at 10 microns. The viscosity of TR9040 is 275 Pa-s. The Tanaka TR9100 silver palladium paste has a sheet resistivity of 100 milli-ohms per square at 10 microns and a viscosity of 275 Pa-s. The material is blended by using a planetary stirring mixer for 1 minute with 2,000 rpm rotation in a dedicated jar.

The resistors are printed at a wet thickness of about 22–25 microns, using a screen of 250 mesh, and a squeegee force of about 1.0–2.0 Kg/cm$^2$, at a printing rate of about 300 mm/sec. The thickness of the two printed resistors is 10–12 microns after drying and firing.

As with the conductors, drying (settling) is performed at 25 deg. C. for 5–10 minutes followed by a drying oven bake at 150 deg. C. for 10–15 minutes. Firing is performed at a peak temperature of 850 deg. C. A typical firing profile is about a 47 minute profile consisting of a firing rise rate of approximately 70 deg. C./minute from room temperature (25 deg. C.) to 850 deg. C., holding at the 850 deg. C. peak temperature for 10 minutes, a firing descent rate of approximately 40 deg. C./minute from 850 deg. C. to 200 deg. C., and a descent rate of approximately 20 deg. C./minute from 200 deg. C. to room temperature (25 deg. C.).

A glass insulation layer is printed such that it completely covers the fired resistors and also covers the shorting conductor printed between the parallel resistors (completing the circuit of the resistors). Only two electrode conductor lands are left uncovered by glass on the top surface. These are left exposed for making contact with terminal strips used to deliver the applied voltage to the heater. No glass is applied to the backside conductor traces. These traces are used to supply voltage to a chip thermistor subsequently.

The insulation glass in this example is Asahi glass paste AP5707 having a thermal coefficient of expansion (TCE) of 7.5–8.1 ppm, annealing point of 650–670 deg. C., an insulation resistance greater than E12 ohm, and having a breakdown voltage greater than 1000 VDC at a thickness less than that printed. The wet thickness is printed in three layers of about 20 microns thick each. The first layer is printed, dried, and fired using the following schedule: drying at 25 deg. C. for 5–10 minutes followed by a drying oven bake at 150 deg. C. for 10–15 minutes. Firing occurs at a peak temperature of 850 deg. C. for a 30 minute to 1 hour firing cycle.

A typical 30 minute firing profile consists of a firing rise rate of approximately 95 deg. C./minute from room temperature (25 deg. C.) to 500 deg. C., a firing rise rate of approximately 70 deg. C./minute from 500 deg. C. to a peak temperature of 850 deg. C. holding at the 850 deg. C. peak temperature for 10 minutes, a firing descent rate of approximately 70 deg. C./minute from 850 deg. C. to 500 deg. C., and a descent rate of approximately 95 deg. C./minute from 500 deg. C. to room temperature (25 deg. C.). The fired thickness is about 12 microns.

The second layer is printed, dried according to the above drying schedule, and then, without firing, the third layer is printed. The third layer is dried and fired according to the above schedule.

The cover glass paste used is Ashai glass paste AP5349, having a TCE of 5.9–6.5 ppm, an annealing point of 450–470 deg. C., and a dielectric strength of greater than 1.5 KVAC. This glass is printed in one layer, having a wet thickness of about 16.5 microns. The glass is dried and fired according to the schedule listed for the insulation glass. The dried thickness is 8–10 microns.

A chip thermistor, such as Semitec 364 FT, is applied to the backside of the heater. This is accomplished by dispensing an electrically conductive epoxy such as EPO-TEK E3082 onto the printed termination electrodes of the silver palladium conductor traces. The chip thermistor is placed such that the contacts of the chip thermistor are bonded to the printed electrodes by the electrically conductive epoxy. The epoxy is cured in an oven at 150 deg. C. for 30 minutes. A silicone encapsulant, such as GE Toshiba TSE 326 silicone, is dispensed over the thermistor/electrode attachment and cured in an oven for 1 hour at 150 deg. C.

The heaters are singulated by snapping through the laser-scribed edges of each individual heater. This may be done with the use of a fixture.

Figure 6A:
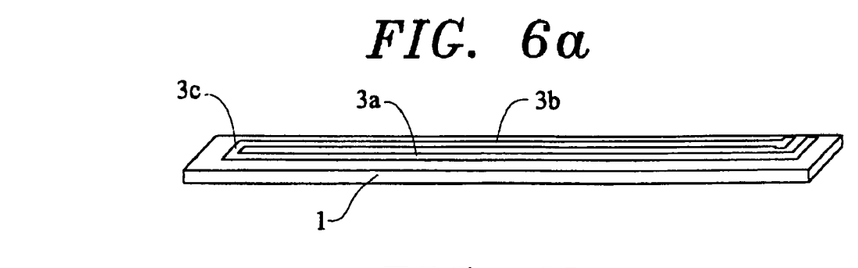
FIG. 6a illustrates a first side of a ceramic heater for a belt fuser.
Figure 6B:
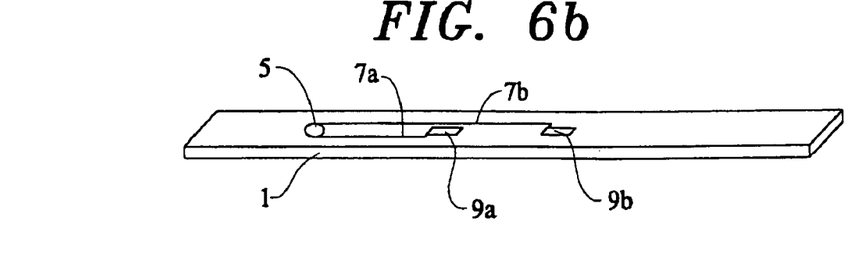
FIG. 6b illustrates the opposite side from the side of FIG. 6a of a ceramic heater for a belt fuser.

FIG. 6a and FIG. 6b show top and bottom views of a belt fuser heater formed in accordance with the foregoing procedures. The ceramic substrate 1 is substantially flat, although it is formed as lamination of the bowed layers as described. Resistive traces 3a and 3b as described are formed on the top and each have a continuous length of at least about 5 millimeters, more preferably at least about 15 millimeters, and preferably extend straight and in parallel at least eight inches so as to be consistent with the width of ordinary papers. Although resistors 3a and 3b are shown to have a continuous connection 3c on one end, connection 3c is typically conductive, but not resistive so as to avoid a concentration of heat at one end of the heater.

FIG. 6b shows the thermistor 5 and conductive traces 7a, 7b with contact pads 9a, 9b. Thermistor 5 is supported on ceramic substrate 1 and thereby responds to the temperature of the substrate 1. As is conventional, this provides an electrical status that is sensed by conductive traces 7a, 7b and transmitted through contact pads 9a, 9b.

Figure 7:
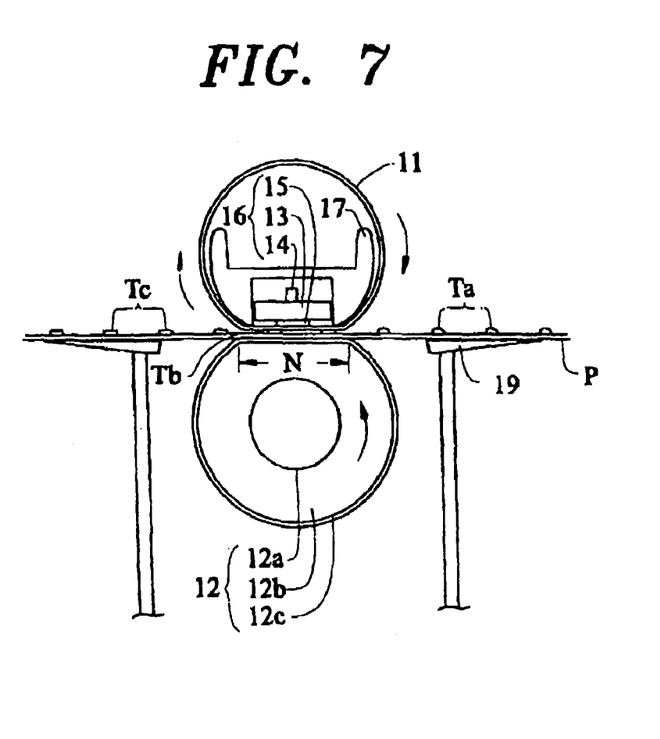
FIG. 7 is illustrative of a belt fuser employing this invention.

FIG. 7 shows a belt fuser using a heater of this invention, such as that of FIG. 6a and FIG. 6b. A fixing film in the form of an endless belt is designated by reference number 11. Pressing roller 12 consists of shaft 12a, typically formed from steel, aluminum, or similar metal; a-rubber elastic layer 12b made of silicon rubber, and surrounded by parting layer 12c, typically consisting of a fluoro polymer sleeve.

Pressing roller 12 is urged to the bottom surface of heater 6 by a resilient member or other urging means (not shown). The bottom travel portion of belt 11 is interposed between heater 16 and pressing roller 12. Roller 12 is driven by an attached gear (not shown) through connection with a series of gears to the gear train of a printer (not shown). Movement of belt 11 is in a clockwise direction and is driven by pressing roller 12, thereby moving media P in the corresponding direction through the nip formed by belt 11 and pressing roller 12.

Belt 11 is an endless tube, which is rotated by contact with the driven pressing roller 12 repeatedly for fixing a toner image. Belt 11 is therefore made of a highly heat resistive and durable material having good parting properties and a total thickness of not more than about 100 microns, preferably less than about 65 microns. The body of belt 11 is a polyimide resin or the like.

To facilitate parting of media P, leaving toner on media P, belt 11 typically has an outer layer (not separately shown) of low surface energy material, such as one or a blend of similar fluoropolymers. On the lower, opposite surface of belt 11, to the surface of heater 16, a layer of high viscosity lubricant or grease (not separately illustrated) is applied to lubricate the inner surface of the belt.

Heater 16 comprises the ceramic substrate 13, extending in a direction substantially perpendicular to the direction of movement of belt 11. Substrate 13, being ceramic, is electrically insulative, has a high thermal conductivity, has low thermal capacity, and has high heat resistance. As discussed in the foregoing, substrate 13, being in accordance with this invention, has exceptionally high heat resistance to thermal stress.

One or more heat generating resistors 15 extend along the length of substrate 13 on the lower surface of substrate 13 (i.e., along the face of heater 16 which directly contacts film 11), and a thermistor or other temperature detecting element 14 is mounted in contact with the back face of the substrate 13 (opposite the face having heat-generating resistors 15). Heater 16 is fixed to a holder 17 with the bottom face of heater 16 facing the nip that receives media P.

Media P carrying toner is supplied to the fixing device guided by an inlet guide 19, and is introduced into a nip N (fixing nip) between the temperature-controlled heater 16 and pressing roller 12, more particularly between fixing belt 11 and pressing roller 12. Media P is passed through fixing nip N at the same speed as belt 11 is moved with the surface of media P having an unfixed toner image Ta being contacted with the bottom surface of belt 11, which is moving in the same direction as media P. Th is toner in nip N. Loose toner Ta is fixed onto media P, such as paper, to form fixed toner Tc.

Alternative Applications

This invention applies to heaters formed on a substrate having one or more continuously printed resistor traces. Each resistor trace has a continuous length of at least about 5 millimeters and preferably about 15 millimeters or more. Similarly conductor traces may be printed in order to complete the circuit and provide contact points for external connectors. The resistor patterns may be in the form of strips printed in a straight line or in a variety of geometric shapes and patterns, as further illustrated by the following examples.

Figure 8A:
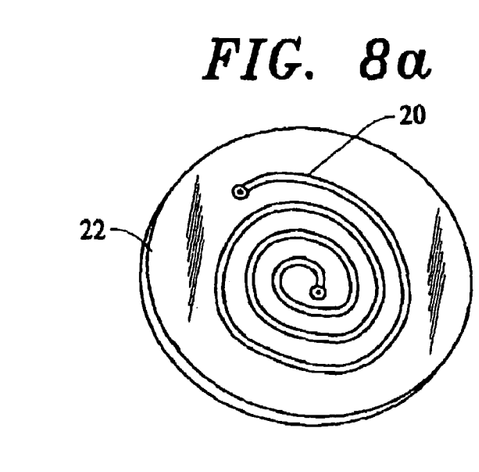
FIG. 8a and FIG. 8b are top and bottom views respectively illustrative of appliance heaters, such as a stovetop heater; having a cooking surface on its upper side.
Figure 8B:
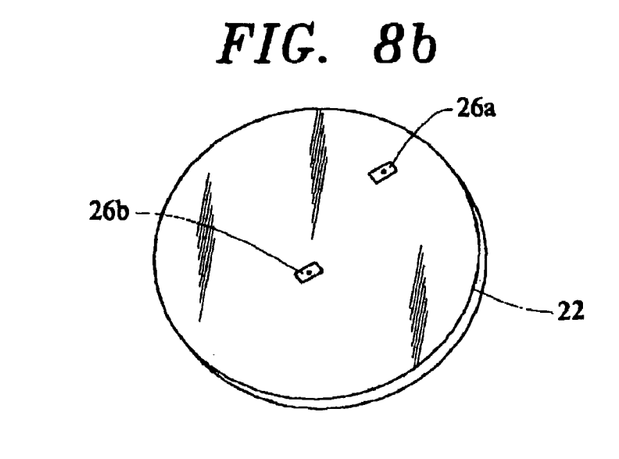
Figure 9:
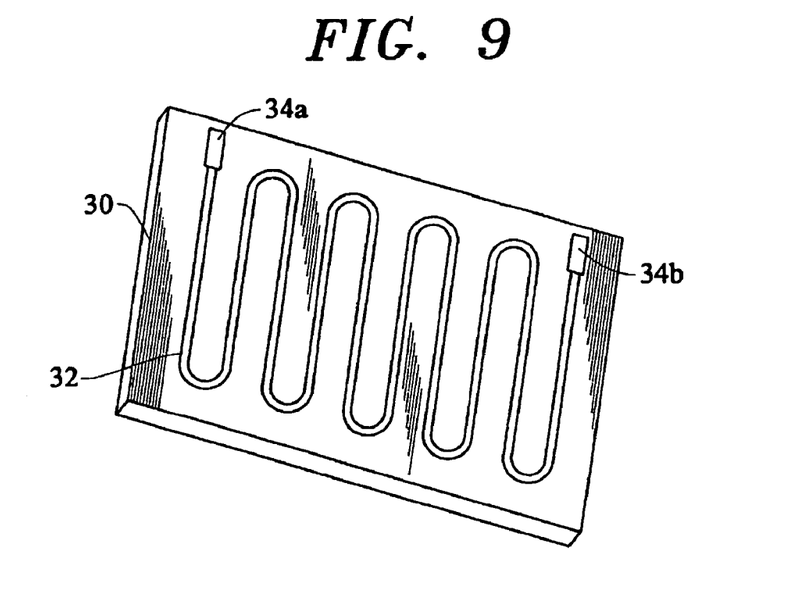
Figure 10:
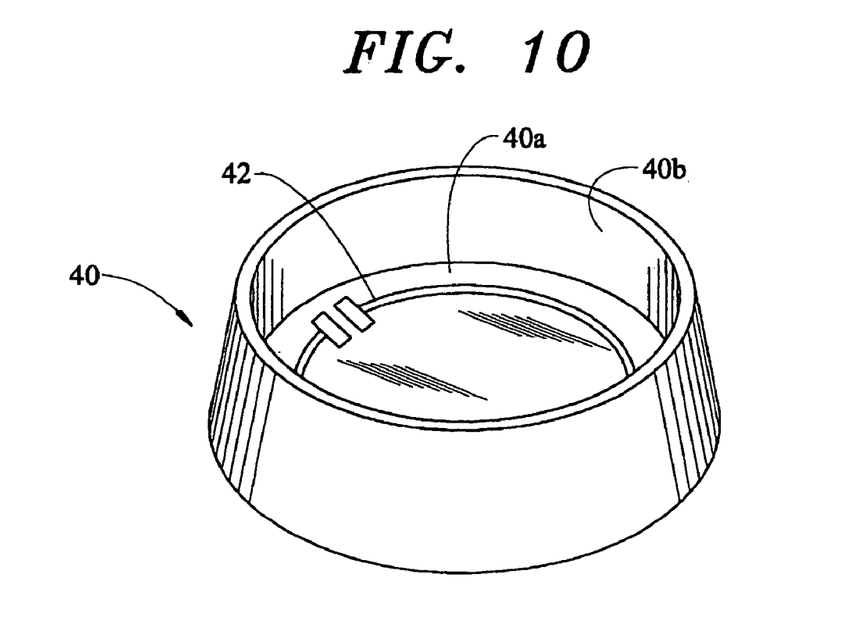
FIG. 10 is an orthogonal view illustrative of a self-heated pot employing this invention.
Figure 11:
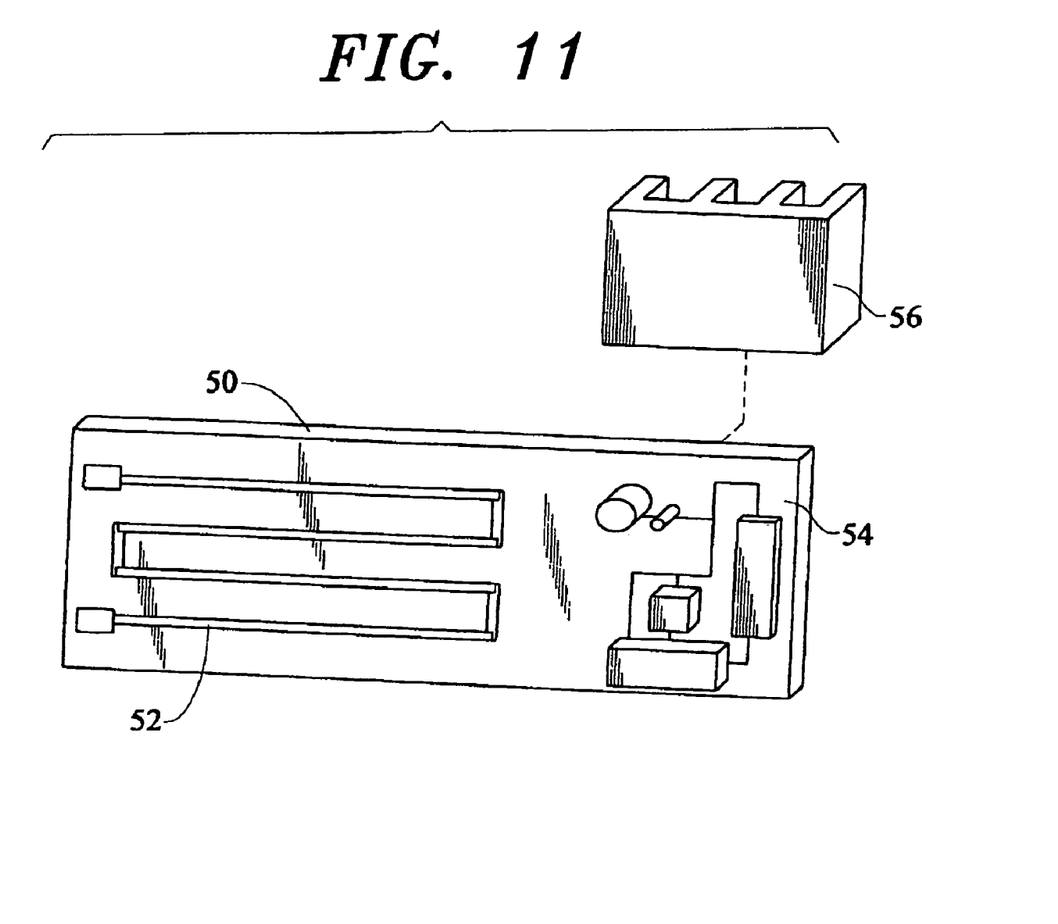
FIG. 11 is an exploded perspective view illustrating a combined heater and electrical controls with a heat sink at the electrical controls.

FIGS. 6a, 6b through 11 illustrate various heater applications using a two laminate substrate alumina heater. More than one resistor trace may be printed as shown in FIG. 6a and FIG. 11, or a single resistor trace may be printed as shown in FIGS. 8, 9 and 10. Conductor traces may be printed and used for connecting external electrical connectors for supplying voltage to the resistors or connecting resistor traces together. Also, conductor patterns may be printed for supplying DC voltage to a thermistor or to other electronic circuitry.

Alumina substrate heaters have the advantage of quick warm-up times compared to conventional heaters due to their relatively low thermal mass. They have the additional advantage of relatively fast and accurate temperature control with the use of a variety of direct contact thermistor types. For example, a thermistor may be applied in chip form such as Semitec device 364-FT (using an electrically conductive epoxy applied directly onto the laminated substrate surface) for relatively fast and accurate temperature measurement and control. In other applications, an external thermistor, such as a Semitec HF-10122 sensor, may be placed in direct contact with the laminated substrate surface.

FIG. 8a and FIG. 8b show an example of one possible form useable for appliance heater applications. Such a heater might be used as either a stovetop heater for direct contact with cooking vessels or as a built-in heater for small appliances such as a teapot, rice cooker or the like. Resistor trace 20 is a continuous expanding spiral on the top surface (FIG. 6a) of a round, ceramic lamination 22 in accordance with this invention. The largest width of the spiral of resistor trace 20 is at in two perpendicular (orthogonal) directions is at least 10 millimeters to accommodate standard cooking utensils.

In the particular arrangement shown, the electrical connectors 26a and 26b (FIG. 8b) for the voltage supply might be made on the backside of the heater. In such an arrangement, the substrate 22 has holes with conductor traces printed such that the conductor material is continuous from the top conductor through the hole ("via") to the bottom conductor.

FIG. 9 illustrates a heater type that might be used in a variety of heating applications such as coupled with a fan for a space heater, drying cabinet heater, or used in a small appliance such as a waffle iron or clothes iron. The pattern and size could be changed to best accommodate the particular application.

The substrate 30 of FIG. 9 is the laminated ceramic of this invention. Substrate 30 carries on one side a resistor trace 32 in a sinusoidal pattern to widely distribute the heat, and conductive contacts 34a and 34b on the same side of substrate 30 as the resistor 32.

FIG. 10 shows a heater example of a vessel 40 of one piece forming a self-heating pot, such as a teapot, coffeepot, rice cooker and the like. The shape and size of the heater could be adjusted to match the particular needs of the vessel. FIG. 10 shows a shallow vessel 40 so as not obscure to elements of particular interest. Vessel 40 has a circular bottom 40a and a substantially cylindrical side 40b generally perpendicular to bottom 40a.

The vessel of FIG. 10 is made entirely of a single ceramic laminate substrate 40 of this invention, carrying on the inner bottom 40a a resistor trace 42 forming a circle almost completely around bottom 40a to distribute the heat across the bottom. As discussed in the foregoing, the ceramic laminate is flexible until cured. Prior to curing in accordance with the embodiment of FIG. 10, the laminate is formed into the form of a bottom with sides and cured.

FIG. 11 shows a type of hybrid board 50 of the ceramic laminate of this invention having a heater circuit 52 and control circuitry 54 on the same support 50. Such arrangements are another example of the advantages of thermal shock resistant laminated substrates. In this case, a heat sink 56 is attached proximate to the control circuitry portion of the support 50, purposely increasing the gradient between the heated and unheated portions of the support to protect the circuitry 54 from excessive heat.

One main advantage of the double layer laminate substrate heater is its greatly improved resistance to thermal gradients and thermal shock. This applies to heating applications in several ways. For example, a heater used as a stovetop burner may undergo significant temperature gradients (on the order of 10–100 deg. C.) by partial coverage of the cooking vessel. The absolute temperature difference created in a heater trace will vary in direct proportion to the length of exposed heater trace. The heater may also undergo thermal shock, such as that caused by water splashing from a pot being heated. Laminated substrate heaters have been shown to withstand repeated thermal gradients on the order of 150 deg. C./mm and thermal shocks such as water shocking when heated to as much as 400 deg. C.

It is contemplated, and will be apparent to those skilled in the art from the preceding description and the accompanying drawings, that modifications and changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A heating element having at least one electrical resistor for heating having a substantially continuous length dimension of at least about 5 millimeters, supported on a ceramic body, said ceramic body comprises an inner layer or layers of a first ceramic material and outer layers of a second ceramic material wherein said first ceramic material has a different coefficient of thermal expansion than said second ceramic material and said outer layers comprise ceramic materials having substantially the same thermal properties.

2. The heating element of claim 1 wherein the resistor has a substantially continuous length dimension of about 15 millimeters or more.

3. The heating element of claim 1 wherein the ceramic material layers comprise alumina ceramic material.

4. The heating element of claim 1 wherein the ceramic material layers have opposed concave surfaces.

5. The heating element of claim 1 wherein the first ceramic material has a lower coefficient of thermal expansion than the second ceramic material.

6. The device of claim 1 further comprising a support member opposed to said heating element, media transport apparatus to move a sheet carrying toner between said support member and said heating element, wherein said heating element has a length dimension of at least 8 inches and said electrical resistor for heating extends along said 8 inch length dimension, wherein said device is characterized as an electrostatic toner fixing device.

7. The device of claim 6 having a driven belt positioned around said heating element to move with said sheet while fixing said toner by heat from said heating element.

8. The device of claim 6 wherein the ceramic material layers comprise alumina ceramic material layers.

9. The device of claim 6 wherein the ceramic material layers have opposed concave regions.

10. The device of claim 6 wherein said resistor has a substantially continuous length dimension of about 15 millimeters or more.

11. The device of claim 6 wherein said first ceramic material has a lower coefficient of thermal expansion than said second ceramic material.

12. The device of claim 6 wherein said inner layer or layers of a first ceramic material has a different firing shrinkage than said outer layers of a second ceramic material and said outer layers are provided by ceramic materials having substantially the same thermal properties.

13. The device of claim 12 wherein said first ceramic material has a higher firing shrinkage than said second ceramic material.

14. The device of claim 1 wherein said heating element includes a substantially flat surface for cooking and said heating element extends across said cooking surface a distance of at least 10 millimeters in each of two orthogonal directions wherein said electrical resistor for heating extends across said 10 millimeters, said ceramic body having a construction that opposes cracking when exposed to thermal stresses.

15. The device of claim 14 in which said electrical resistor for heating comprises a spiral-shaped resistor making at least one revolution.

16. The device of claim 14 wherein the ceramic material layers have opposed concave regions.

17. The device of claim 14 wherein the ceramic material layers comprise alumina ceramic material layers.

18. The device of claim 14 wherein said first ceramic material has a lower coefficient of thermal expansion than said second ceramic material.

19. The device of claim 14 wherein the ceramic material layers are selected to provide a construction that opposes cracking when exposed to thermal stresses.

20. The device of claim 1 wherein said heating element includes a bottom and sides to form a heating pot, wherein said inner layer or layers and said outer layers are selected to provide a construction that opposes cracking when exposed to thermal stresses, wherein said bottom supports said electrical resistor for heating over an area of said bottom.

21. The device of claim 20 wherein the ceramic material layers comprises alumina ceramic layers.

22. The device of claim 20 wherein said first ceramic material has a lower coefficient of thermal expansion than said second ceramic material.

23. The device of claim 1 further comprising electrical circuitry elements spaced-apart from said electrical resistor on said ceramic body, said ceramic body also supporting a heat sink proximate to said electrical circuitry element.

24. The device of claim 23 wherein the ceramic material layers comprise alumina ceramic material layers.

25. The device of claim 23 wherein said first ceramic material has a lower coefficient of thermal expansion than said second ceramic material.

26. The device of claim 1 wherein said outer layers comprising ceramic materials having substantially the same thermal properties comprise ceramic materials comprising substantially the same coefficient of thermal expansion.

27. The device of claim 1, wherein said ceramic body comprises aluminum oxide.

28. The device of claim 1 wherein said ceramic body has a thickness of about 2 millimeters.

* * * * *